(12) United States Patent
Chao et al.

(10) Patent No.: US 11,527,627 B2
(45) Date of Patent: Dec. 13, 2022

(54) SEMICONDUCTOR SCHOTTKY RECTIFIER DEVICE

(71) Applicant: Diodes Incorporated, Plano, TX (US)

(72) Inventors: Kolins Chao, Zhubei (TW); John Huang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 16/922,048

(22) Filed: Jul. 7, 2020

(65) Prior Publication Data

US 2021/0217857 A1 Jul. 15, 2021

Related U.S. Application Data

(60) Provisional application No. 62/960,740, filed on Jan. 14, 2020.

(51) Int. Cl.
*H01L 29/417* (2006.01)
*H01L 29/872* (2006.01)
(Continued)

(52) U.S. Cl.
CPC ............ *H01L 29/417* (2013.01); *H01L 24/13* (2013.01); *H01L 29/404* (2013.01);
(Continued)

(58) Field of Classification Search
CPC ... H01L 29/08; H01L 29/083; H01L 29/0834; H01L 29/0839; H01L 29/1016; H01L 29/102; H01L 29/417; H01L 29/407; H01L 29/4175; H01L 29/41766; H01L 29/41775; H01L 29/41716; H01L 29/66143; H01L 29/66212; H01L 29/66257; H01L 29/7308; H01L 29/7839; H01L 27/0255; H01L 27/0262; H01L 27/0766; H01L 27/0811; H01L 27/0814; H01L 27/0817; H01L 27/095; H01L 27/1021; H01L 27/1027; H01L 2224/13155; H01L 2224/13021; H01L 2224/13144; H01L 24/13; H01L 29/66712–66734; H01L 29/7802–7815; H01L 29/66666; H01L 29/7827–7828; H01L 29/78642; H01L 27/085–098; H01L 27/0922; H01L 27/105; H01L 27/11526; H01L 27/11546; H01L 29/7845; H01L 29/7846; H01L 29/782; H01L 29/872; H01L 29/8725; H01L 29/404;
(Continued)

(56) References Cited

U.S. PATENT DOCUMENTS 5,583,368 A * 12/1996 Kenney .............. H01L 27/0922
257/621
2003/0040144 A1* 2/2003 Blanchard ......... H01L 29/41766
257/373
(Continued)

*Primary Examiner* — Natalia A Gondarenko
(74) *Attorney, Agent, or Firm* — Kilpatrick Townsend & Stockton LLP

(57) ABSTRACT

A semiconductor Schottky rectifier built in an epitaxial semiconductor layer over a substrate has an anode structure and a cathode structure extending from the surface of the epitaxial layer. The cathode contact structure has a trench structure near the epi-layer and a vertical sidewall surface covered with a gate oxide layer. The cathode structure further comprises a polysilicon element adjacent to the gate oxide layer.

12 Claims, 22 Drawing Sheets

(51) Int. Cl.
*H01L 29/40* (2006.01)
*H01L 23/00* (2006.01)

(52) U.S. Cl.
CPC ........ H01L 29/407 (2013.01); H01L 29/8725 (2013.01); *H01L 2224/13021* (2013.01); *H01L 2224/13144* (2013.01); *H01L 2224/13155* (2013.01)

(58) Field of Classification Search
CPC ......... H01L 21/8232–8239; H01L 21/823462; H01L 21/823842; H01L 21/823857; H01L 21/823487
USPC .................................................. 257/288, 330
See application file for complete search history.

(56) References Cited

U.S. PATENT DOCUMENTS

| | | | | |
|---|---|---|---|---|
| 2007/0290234 | A1* | 12/2007 | Wu | H01L 29/872 257/212 |
| 2008/0067623 | A1* | 3/2008 | Coolbaugh | H01L 29/66143 257/471 |
| 2009/0315106 | A1* | 12/2009 | Hsieh | H01L 27/0629 257/334 |
| 2012/0205670 | A1* | 8/2012 | Kudou | H01L 29/7828 257/E29.313 |
| 2014/0145296 | A1* | 5/2014 | Hirler | H01L 29/0649 257/506 |
| 2020/0006580 | A1* | 1/2020 | Quddus | H01L 27/0727 |

* cited by examiner

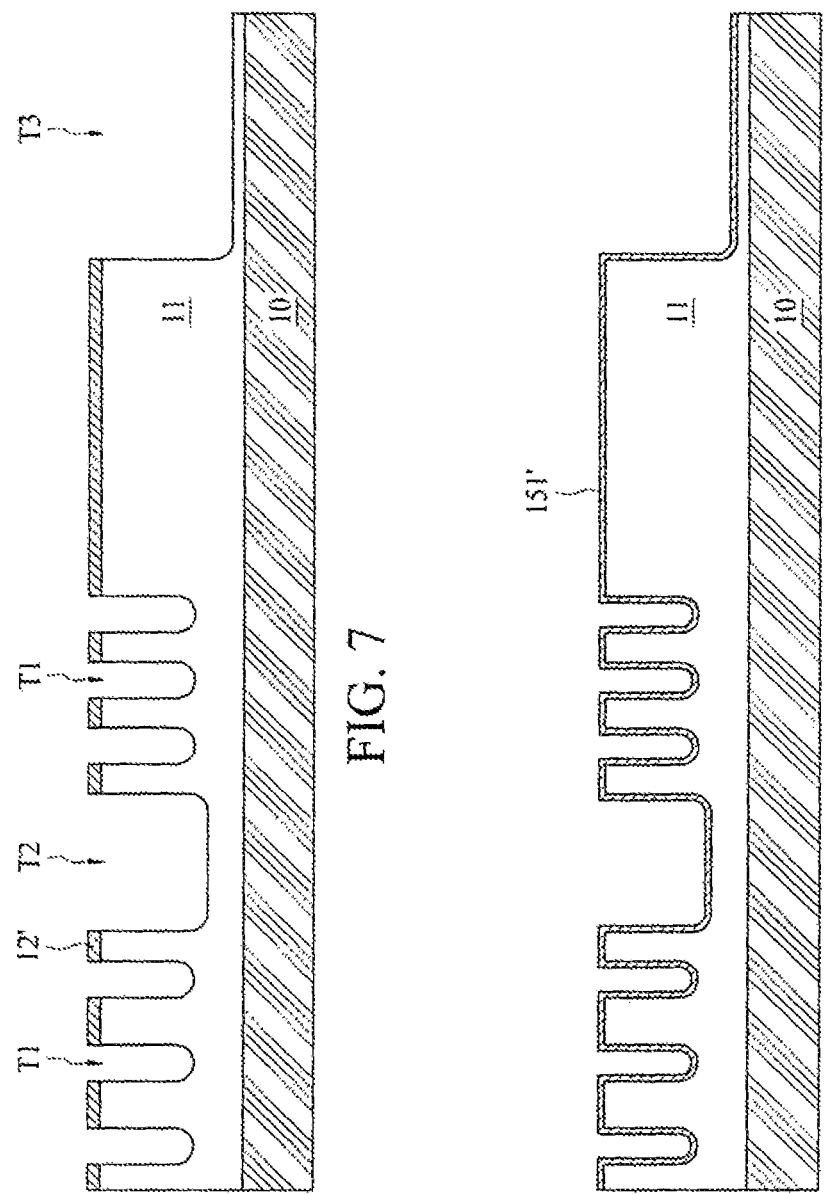

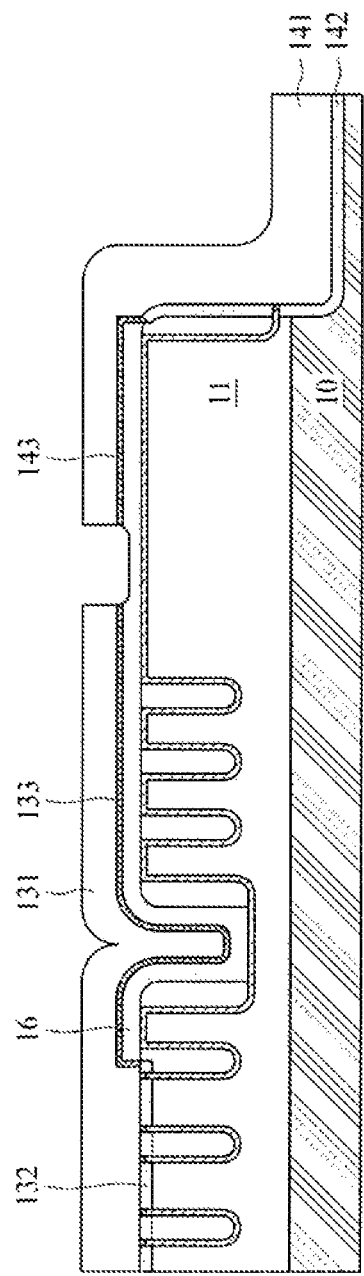
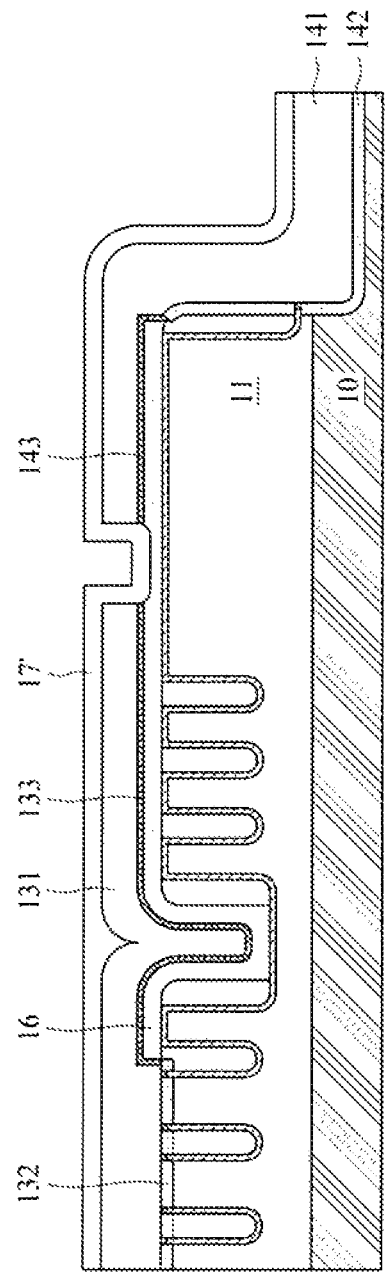

SEMICONDUCTOR SCHOTTKY RECTIFIER DEVICE

BACKGROUND

Features that Schottky rectifiers need in order to satisfy the requirement of Chip-Scale Package (CSP) include laterally arranged anode and cathode, no lead frame, and no wire bond. FIG. 1 is a cross section diagram of a conventional semiconductor Schottky rectifier. The Schottky rectifier in FIG. 1 includes a substrate, a semiconductor epitaxial layer (epi-layer) over the substrate, a $POCl_3$ doped area in the epi-layer and an anode and a cathode over the epi-layer. The cathode is formed over the $POCl_3$ doped area. The Schottky rectifier has forward voltage ($V_f$) margin issue due to high epi-resistivity and high cathode contact resistance, which causes low yield. Conventionally, the thickness of the substrate is over 650 um, and $V_f$ can be improved by the addition of a wafer backside grinding process and backside metal deposition process. For the back grinding to 50 um thickness, the process needs a wafer to wafer bonding before grinding. This process is costly. Another problem is the process fluctuation, such as when density of dopants in $POCl_3$ doped area changes, or back grinding and backside metal deposition condition shift, that can cause a yield problem with respect to $V_f$ spreading. Therefore, there is a need for a novel structure, device configuration and fabrication process to overcome the problems associated with conventional planar Schottky CSP device structure.

SUMMARY OF THE INVENTION

The purpose of this paper is to describe a semiconductor Schottky rectifier that has a better forward voltage ($V_f$) and leakage current (IR) characteristics. A Schottky rectifier that can be applied to a higher current, e.g. 4 ampere (A) or higher, and with advantages of small dimensions and broader field of applications, and can satisfy the requirement of chip-scale package (CSP).

The semiconductor devices that embody the disclosed invention generally comprise an anode structure and a cathode structure, each of which being accessible from the top surface of an epi-layer, and each comprises a trench structure formed in the epi-layer.

The cathode structure, in particular, is fabricated with a multi-step etching process. As a result, near the top of the epi-layer surface, the cathode trench structure forms a vertical sidewall with a horizontal extension at the bottom. The surfaces of the sidewall and the bottom extension are covered with a gate oxide film.

The gate oxide film separates the epi-layer from a polysilicon element. In some embodiments of this invention, the side of the polysilicon element away from the epi-layer sidewall is covered by an interlayer dielectric layer such as silicon dioxide; in other embodiments, this surface is covered by a metal silicide film.

Because of this novel combination of the cathode and the anode structure and the novel process with which it is fabricated, a silicon Schottky rectifier that embodies this invention can be operate at high current and has small dimensions for chip-scale package (CSP).

BRIEF DESCRIPTION OF DRAWINGS

FIG. 7 depicts a cross section view of the wafer in FIG. 6 after trenches are etched extending into the wafer.

FIG. 8 depicts a cross section view of the wafer in FIG. 7 after a gate oxide film is disposed on the top surface of the wafer.

FIG. 36 depicts the etching of exposed metal layer to isolate the anode from the cathode.

FIG. 37 depicts the deposition of a passivation layer over the wafer in FIG. 36.

DETAILED DESCRIPTION

Figure 2:
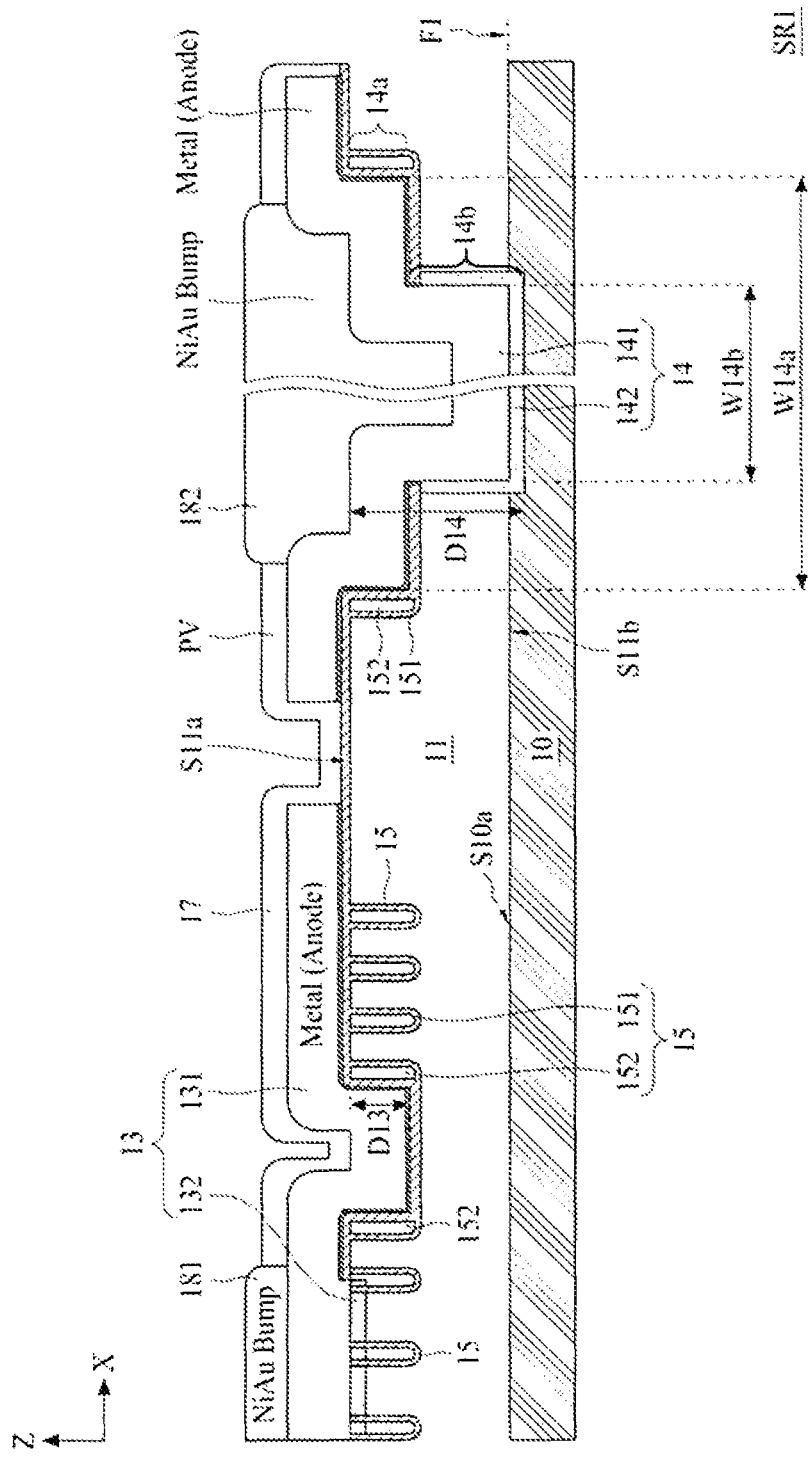
FIG. 2 depicts a cross section view of a Schottky rectifier with a cathode formed in a trench.

FIG. 2 depicts one embodiment SR1 of this invention. The Schottky rectifier SR1 comprises a substrate 10, an epi-layer 11 disposed over the substrate 10, an anode 13 and a cathode 14. The thickness (measured along the Z direction) of the substrate 10 is about 250 micro-meters (μm). In other embodiments, the substrate may be thinned to about 5 μm. The anode 13 includes an anode metal 131 and a Schottky contact at the bottom of a silicide layer 132. The cathode 14 includes the cathode metal 141 and the silicide layer 142. The anode 13 and the cathode 14 are disposed over the epitaxial layer 11 and are laterally arranged along an extending direction (e.g. the X direction). The anode 13 and the cathode 14 are disposed in the epitaxial layer 11. The depth D13 of the anode 13 from a top surface S11a of the epitaxial layer 11 is less than a depth D14 of the cathode 14 from the same top surface. The anode 13 extends into the epitaxial layer 11 without penetrating through the epitaxial layer 11, and the cathode 14 in this embodiment extends into and penetrates though the epitaxial layer 11. In some other embodiments, the cathode 14 may stop near the interface between the epitaxial layer 11 and the substrate 10. The bottom surface S11b of the epitaxial layer 11 and a top surface S10a of the substrate 10 form an interface F1.

The Schottky contact is disposed between the silicide layer 132 and the epitaxial layer 11. In this embodiment, the silicide is titanium silicide ($TiSi_x$).

The Schottky rectifier SR1 further includes a passivation layer 17 disposed over the anode 13, the cathode 14, and the epitaxial layer 11. The passivation layer 17 is also disposed between the anode metal 131 and the cathode metal 141 to electrically isolate them. The Schottky rectifier SR1 further include plated NiAu bumps 181 and 182 on top of the passivation layer 17, electrically connect to the anode metal 131 and the cathode metal 141.

The Schottky rectifier SR1 as depicted in FIG. 2 further includes trench structures 15 in the epitaxial layer 11 surrounding the anode 13, and optionally surrounding a portion of the cathode. Each of the trench structures, including an element around the cathode, includes a dielectric layer 151 and a fill material 152. In some embodiments, the dielectric layer 151 includes oxide, and the fill material 152 includes polysilicon. A series of the trench structures 15 surrounding the anode 13 forms guard rings or a termination structure. The polysilicon layer 152 may be doped with phosphorous or other suitable dopants to lower its resistivity.

In the embodiment depicted in FIG. 2, the Schottky rectifier SR1 includes a Schottky junction under the silicide layer 132, which is surrounded by trench structures 15. The anode 13 may also be surrounded by guard ring structures. Number of guard ring structures may vary in different embodiments.

In the embodiment depicted in FIG. 2, the upper portion 14a of the cathode 14 in the epitaxial layer 11 has a width W14a along the X direction and is greater than the width of a lower portion W14b. In this embodiment, the upper portion 14a of the cathode 14 is surrounded by a polysilicon element 152.

In order to illustrate some of the novel properties and advantages of the Schottky rectifier SR1, an exemplary method M10 for forming such a silicon Schottky rectifier is described below.

The method M10 includes steps O101 to O130:

(O101) wafer start: providing a wafer including a silicon epitaxial layer on a heavily doped silicon substrate;

(O102) trench hard mask oxide deposition (e.g. by CVD);

(O103) trench photoresist patterning;

(O104) trench hard mask oxide dry etching (opening the cell area including the termination region, the anode, and the cathode region);

(O105) photoresist removal;

(O106) trench etching using the hard mask oxide as a mask;

(O107) sacrificial oxide growth;

(O108) sacrificial oxide removal;

(O109) gate oxide (GOX) growth;

(O110) in-situ n-type poly deposition;

(O111) poly silicon etching back;

(O112) interlayer dielectric layer (ILD) deposition;

(O113) contact photoresist patterning on anode & cathode regions;

(O114) ILD and GOX etching;

(O115) photoresist removal;

(O116) second contact photoresist patterning opening in the cathode region;

(O117) cathode region silicon recess etching to the substrate to form stepped trench in the cathode region;

(O118) photoresist removal;

(O119) Ti sputtering;

(O120) rapid thermal process (RTP) to form $TiSi_x$ and Schootky junction diode;

(O121) metal layer deposition;

(O122) photoresist patterning on the metal layer;

(O123) metal etching;

(O124) photoresist removal;

(O125) passivation film deposition (e.g. by CVD);

(O126) passivation photoresist patterning;

(O127) passivation film etching;

(O128) photoresist removal;

(O129) sintering and wafer testing; and (O130) metal plating to form contact bumps on the metal layer.

FIG. 3 to FIG. 20 are drawings of cross sections of the Schottky rectifier SR1 at different stages of the process method M10.

Figure 3:
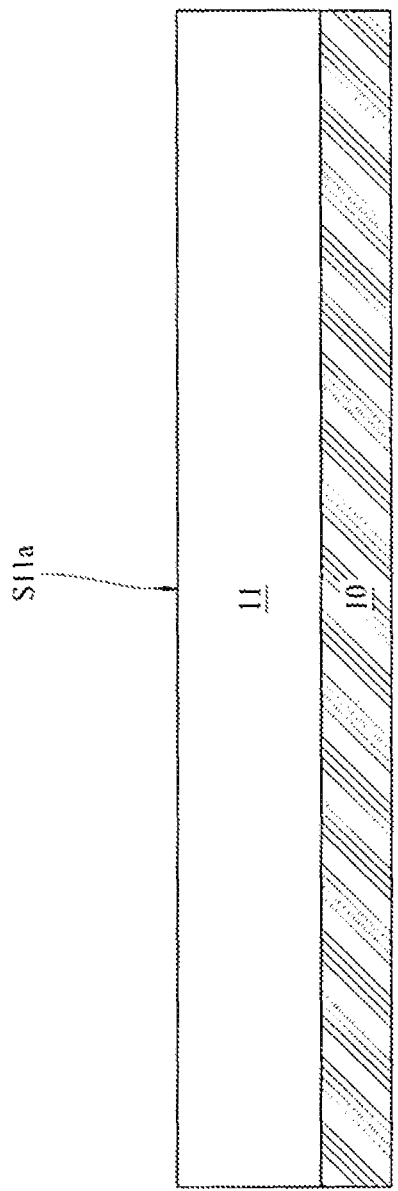
FIG. 3 depicts a cross section view of a starting wafer.

Referring to FIG. 3, in accordance with the operation O101, a wafer including a substrate 10 and an epitaxial layer 11 over the substrate is provided. The thickness of the epitaxial layer may be from 5 µm to over 100 µm, depending on the operating voltage of the intended rectifier. The substrate 10 is heavily doped, for example, with V group elements to form an N-type substrate. The thickness of the substrate may be around 650 µm to over 900 µm depending on the diameter of the starting wafer. At the end of the manufacturing process, the substrate may be thinned down to between 20 µm to 100 µm.

Figure 4:
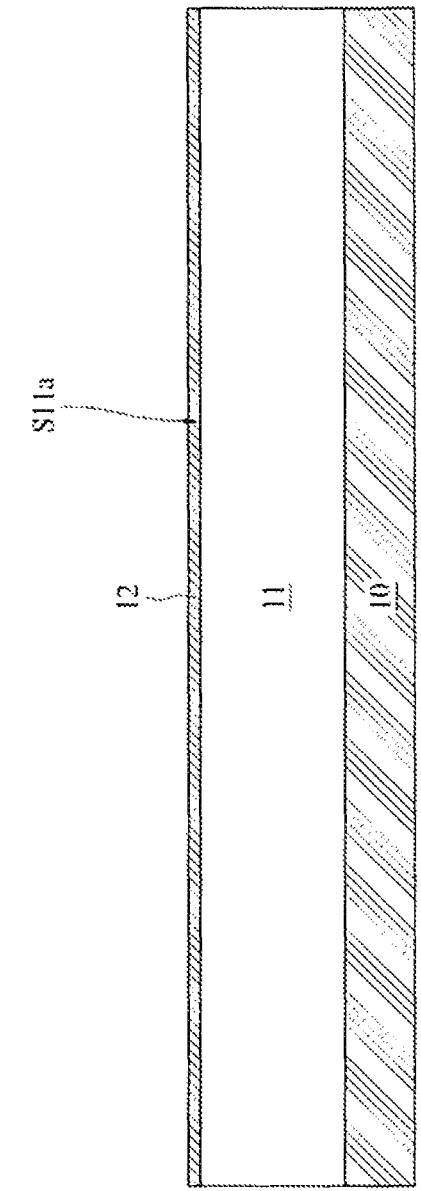
FIG. 4 depicts a cross section view of the starting wafer in FIG. 3 after an oxide film is disposed on the top surface.

Referring to FIG. 4, in accordance with the operation O102, a hard mask layer 12 is formed over the epitaxial layer 11. The layer 12 can be formed by chemical vapor deposition (CVD) or by thermal oxidation or both.

Figure 5:
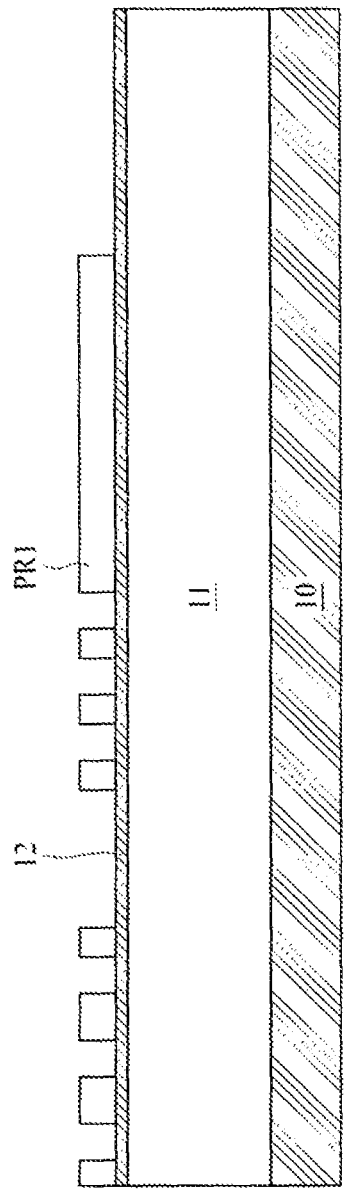
FIG. 5 depicts a cross section view of the starting wafer in FIG. 4 with a photoresist pattern disposed over the oxide film.

Referring to FIG. 5, in accordance with the operation O103, a photoresist pattern PR1 is formed to define trenches T1, T2, and T3. As depicted in FIG. 5, the photoresist PR1 exposes portions of the oxide layer 12 in an anode region and a cathode region, and the guard rings for defining positions of the trenches T1, T2 and T3.

Figure 6:
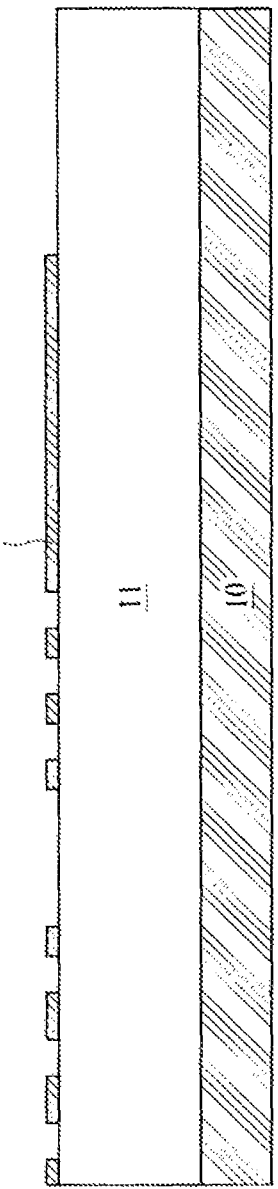
FIG. 6 depicts a cross section view of the wafer in FIG. 5 after the oxide film is etched.

Referring to FIG. 6, in accordance with the operations O104-O105, the hard mask layer pattern is formed by etching and the photoresist PR1 is removed. The exposed portions of the hard mask layer 12 include the trench termination regions, the anode region, and the cathode region.

Referring to FIG. 7, in accordance with the operation O106, the exposed portions of the epitaxial layer 11 are etched to from a plurality of trenches. The plurality of trenches includes several trenches T1, a trench T2, and a trench T3 (partially depicted herein). All of the trenches T1, T2 and T3 are terminated in the epitaxial layer 11. In the embodiment, the trenches are formed by a dry etching operation, and the depth of the trench T3 is greater than the depths of the trench T2, which is deeper than the trenches T1, due to the difference in the opening size of the trenches. The relative scale of the anode 13 and cathode 14 along the X direction is for illustration only.

Referring to FIG. 8, in accordance with the operations O107-O109, a sacrificial oxide layer is formed in O107 and removed in the operation O108. The purpose of forming and removing the layer is to smooth the surfaces of the trenches. In this embodiment, the removal of the sacrificial oxide layer includes a wet etching operation. With the operation O109, a gate oxide film 151' is formed. The formed film is conformal to the surface contour of the epitaxial layer 11 including the trenches T1, T2, and T3.

Figure 9:
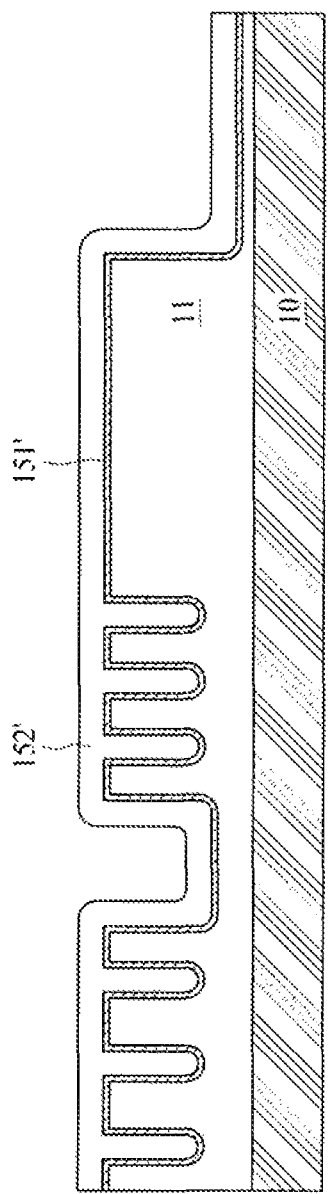
FIG. 9 depicts a cross section view of the wafer in FIG. 8 after a polysilicon film is disposed on the top surface of the wafer.

Referring to FIG. 9, in accordance with the operation O110, a polysilicon layer 152' is deposited over the gate oxide 151'. As depicted in FIG. 9, the polysilicon layer 152' fills the trenches T1 and lines the trench surfaces of T2 and T3. The width of the trenches T1 is relatively small, so the polysilicon layer 152' fills up the trenches T1. On the other hand, because the widths of the trenches T2 and T3 are wider, the polysilicon layer 152' only covers the surface of the trenches T2 and T3 without filling up the trenches. In this embodiment, the polysilicon layer 152' is doped with a V group element to form an N-type polysilicon.

Figure 10:
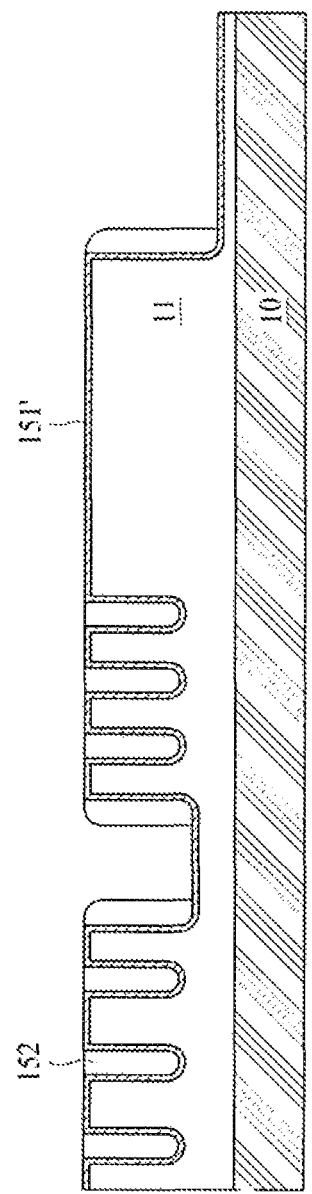
FIG. 10 depicts a cross section view of the wafer in FIG. 9 after the polysilicon film is etched back.

Referring to FIG. 10, in accordance with the operation O111, an anisotropic etching back operation is performed to etch back the polysilicon to expose the gate oxide 151'. The etching back operation is performed to remove the surface portion of the polysilicon layer 152' to form the polysilicon filler 152 inside the trenches T1. It also leaves the sidewalls of the trenches T2 and T3 covered by polysilicon sidewall elements.

Figure 11:
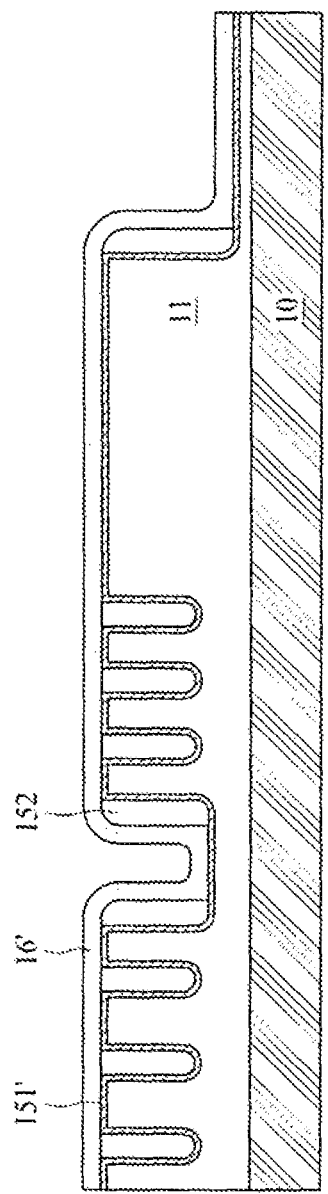
FIG. 11 depicts a cross section view of the wafer in FIG. 10 after an interlayer dielectric film is disposed on the top of the wafer.

Referring to FIG. 11, in accordance with the operation O112, an interlayer dielectric layer (ILD) 16' is deposited on the wafer surface. In this embodiment, the ILD 16' is an oxide layer. The ILD 16' lines the trenches T2 and T3 and covers the polysilicon sidewall features inside the trenches T2 and T3.

Figure 12:
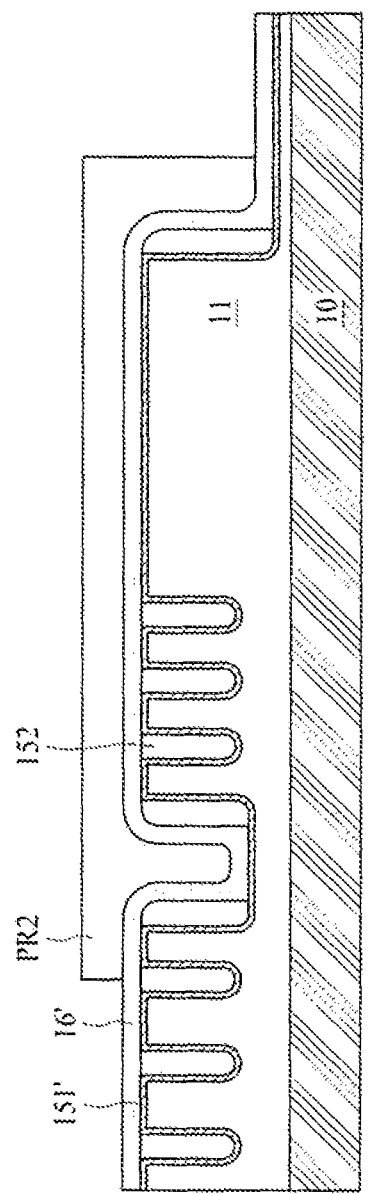
FIG. 12 depicts a cross section view of the wafer in FIG. 11 after a photoresist pattern delineating the anode and the cathode regions is disposed on the top of the wafer.

Referring to FIG. 12, in accordance with the operation O113, a photoresist pattern PR2 is in place to cover the trench T2 and a portion of the trench T3, and exposing the underneath oxide layer 16'. The pattern PR2 is to define the contacts in the anode region and the cathode region. In this embodiment, the photoresist PR2 covers the polysilicon sidewalls in the trench T3.

Figure 13:
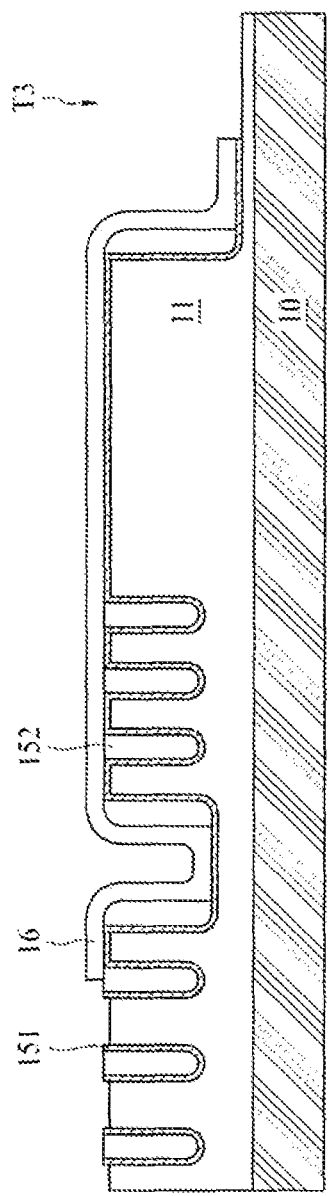
FIG. 13 depicts a cross section view of the wafer in FIG. 12 after the exposed interlayer dielectric and gate oxide are removed by etching.

Referring to FIG. 13, in accordance with the operations O114 and O115, the exposed portions of the ILD 16' and portions of the gate oxide 151' underlying the exposed portions of the ILD are removed by one or more etching operations. The remained portions of the gate oxide 151 are depicted in FIG. 13 as in FIG. 2. The remained portion of the ILD 16 covers trench T2, portion of one trench T1, and a portion of the bottom of the trench T3.

Figure 14:
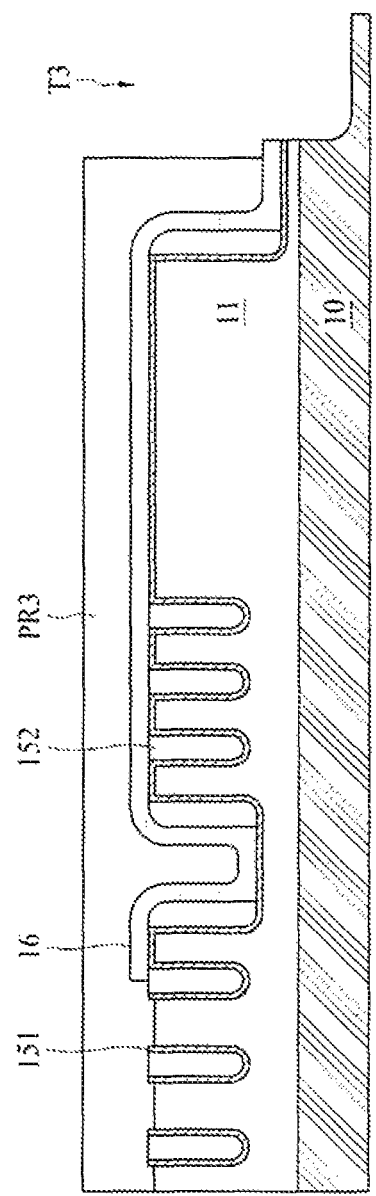
FIG. 14 depicts a second photoresist pattern applied and the exposed silicon of the wafer removed by etching.

Referring to FIG. 14, in accordance with the operations O116, a photoresist pattern PR3 is formed to expose a portion of the bottom of the trench T3. In operation O117, after first removing the exposed oxide, the remaining epitaxial layer 11 at the bottom of the trench T3 is removed to expose the substrate 10 and thus forming a step feature near the bottom of trench T3. In some embodiments, the ILD 16 over the top of the step feature is removed to expose the remaining epi-layer 11.

Figure 15:
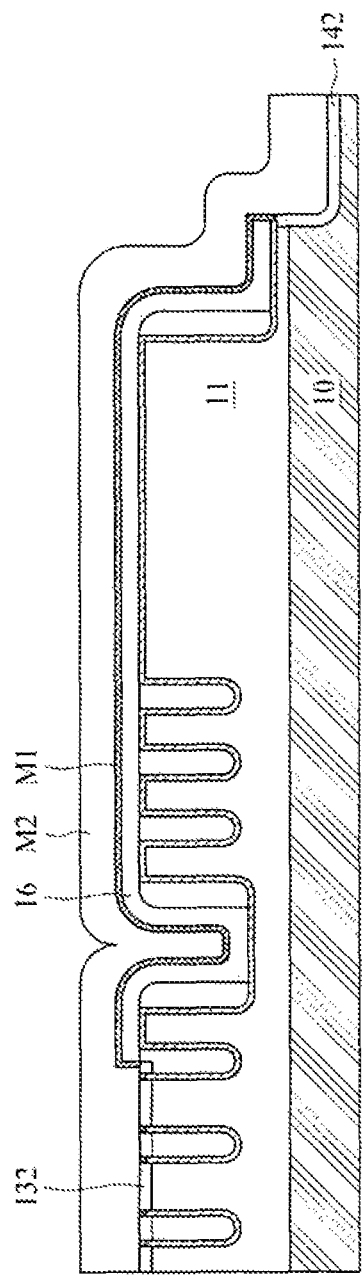
FIG. 15 depicts on the wafer of FIG. 14 after the formation of a silicide layer and the subsequent deposition of a metal layer.

Referring to FIG. 15, in the operations O118, the photoresist PR3 is removed. In step O119 a metal layer M1 is placed on the wafer, in step O120 a thermal treatment is performed, and in step O121 another metal layer M2 is deposited over the wafer surface. The metal layer M1 in this embodiment includes titanium (Ti) and is deposited by sputtering. The thermal treatment includes a rapid thermal process (RTP) to form a Schottky junction diode under a titanium silicide layer 132 and a titanium silicide layer 142. As depicted in FIG. 15, the metal layer M1 in contact with silicon materials (the polysilicon layer 152, the epitaxial layer 11, and the substrate 10 form metal silicide, and a Schottky junction diode at the interface of silicide 132 and the epitaxial layer layers. The portions of the metal M1 in contact with the gate oxide layer 15 and the dielectric layer 16 do not form silicide. Metal layer M2 is then formed over the metal silicide layers 132 and 142 and the remaining metal layer M1. The metal layer M2 fills up the trench T2 and conformably covers trench T3. The metal layer M2 in this embodiment is an alloy including AlSiCu.

Figure 16:
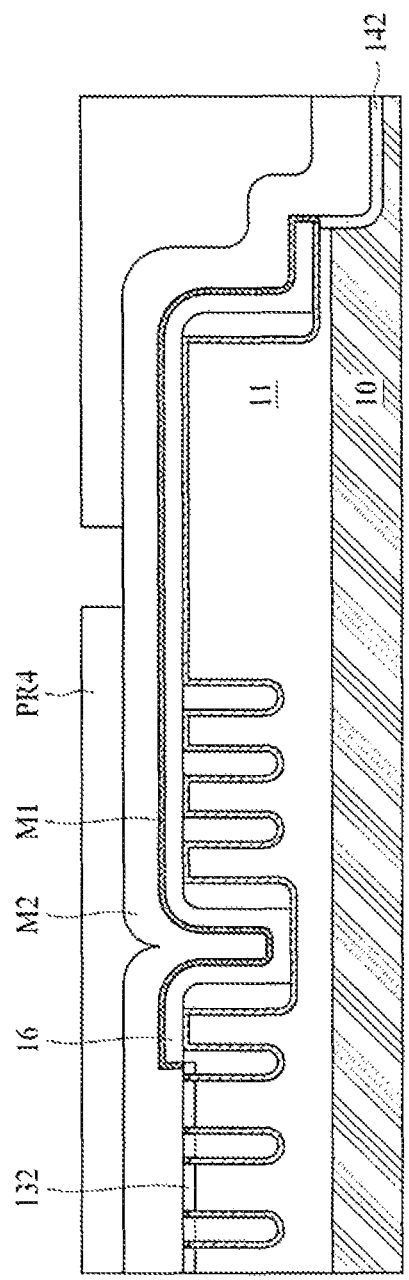
FIG. 16 depicts a photoresist pattern disposed over the metal layer.

Referring to FIG. 16, in accordance with the operation O122, a photoresist pattern PR4 is formed on the metal layer M2 to expose a gap between the anode region and the cathode region.

Figure 17:
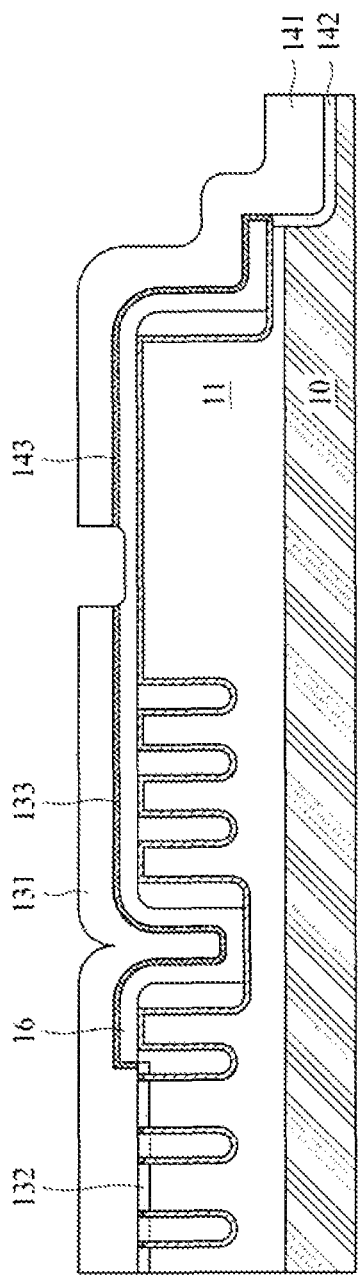
FIG. 17 depicts the etching of exposed metal layer to isolate the anode from the cathode.

Referring to FIG. 17, in accordance with the operations O123, a metal etching operation is performed to remove the exposed portion of the metal layer M2 and the M1. Thus, the anode 13 and the cathode 14 are electrically separated. The portion of the metal layer M2 in the anode region becomes the anode metal 131 and functions as a contact pad of the anode electrode 13. The portion of the metal layer M2 in the cathode region becomes the cathode metal 141 and functions as a contact pad of the cathode electrode 14. In step O124, the photoresist PR4 is removed.

Figure 18:
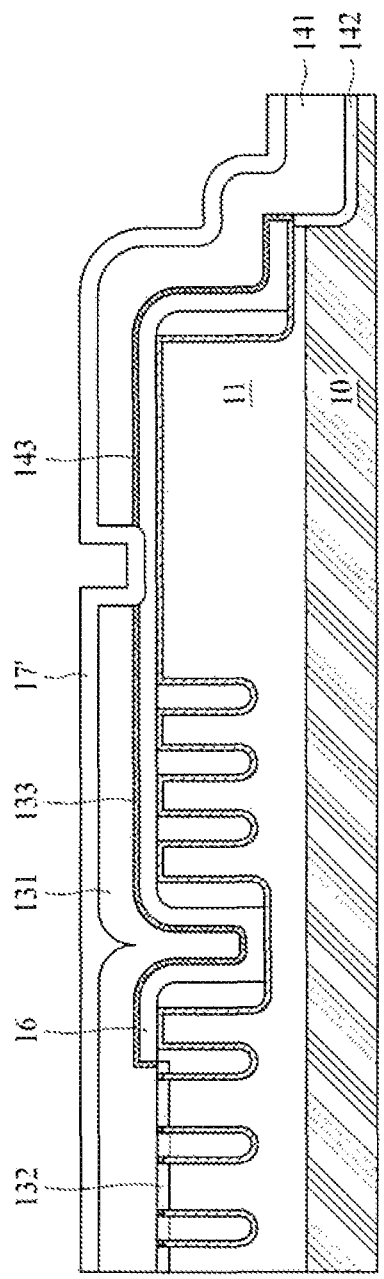
FIG. 18 depicts the deposition of a passivation layer over the wafer in FIG. 17.

Referring to FIG. 18, in accordance with the operation O125, a passivation layer 17' is deposited over the wafer. The passivation layer 17' may include oxide, nitride, oxynitride, or their combinations. The passivation layer 17' in this embodiment is formed by a CVD process.

Figure 19:
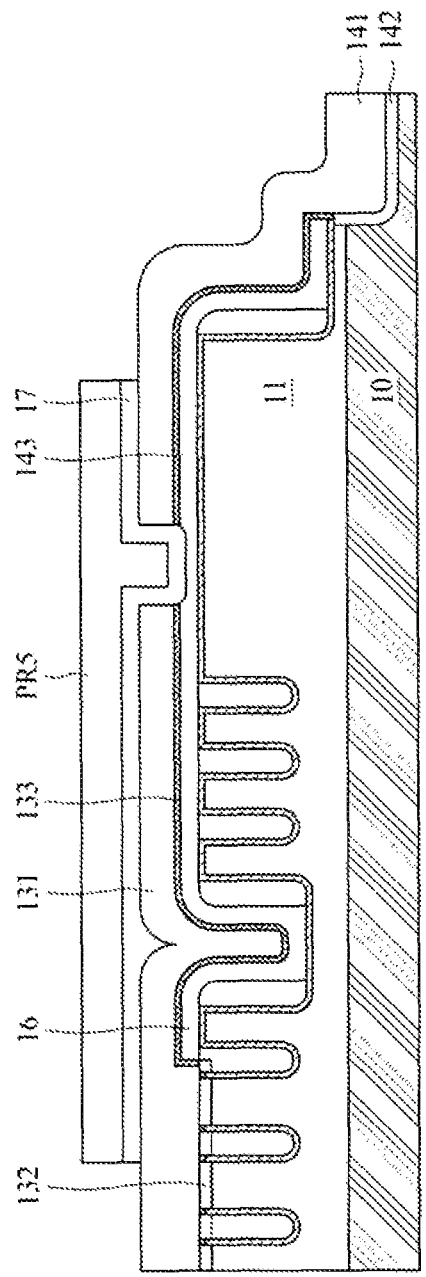
FIG. 19 depicts the structure of FIG. 18 after the passivation layer is removed from the cathode and the anode regions.

Referring to FIG. 19, in accordance with the operation O126, a photoresist pattern PR5 is formed to expose portions of the passivation layer over a portion of the anode metal 131 and a portion the cathode metal 141. The exposed portions of the passivation layer 17' are then removed by an etching process O127.

Figure 20:
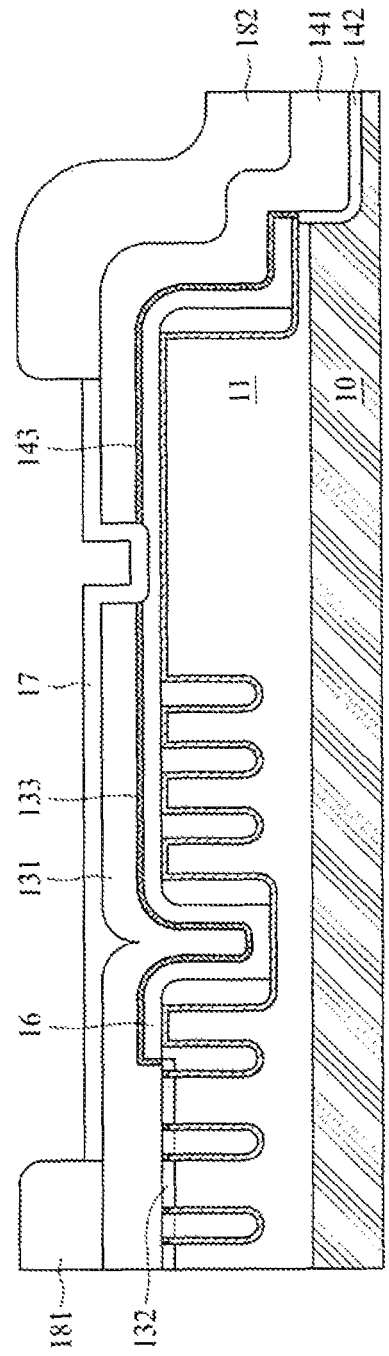
FIG. 20 depicts the structure of FIG. 19 after a layer of metal is plated at the cathode and anode regions.

Referring to FIG. 20, in accordance with the operation O128, the photoresist is removed. The wafer is then sintered in step O129 and is ready for testing for wafer level yield evaluation. In step O130 a chemical plating operation is performed to form the solder bumps 181 and 182. A die sawing process and then a final test will be performed after the operation O130.

Figure 1:
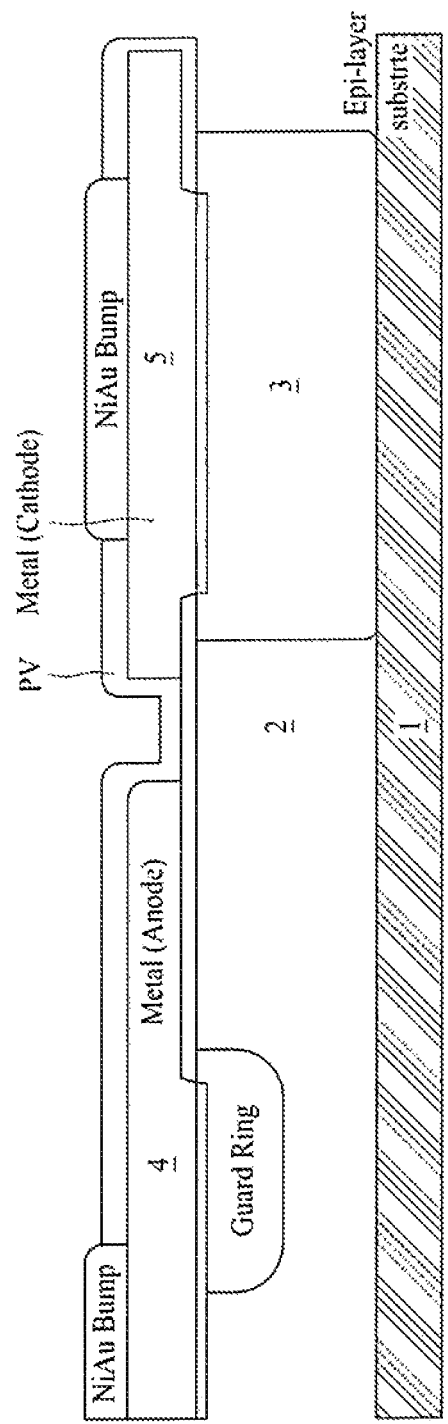
FIG. 1 depicts a cross section view of a Schottky rectifier with a cathode formed by a POCL doped region.

The Schottky rectifier SR1 fabricated with process M10 has a cathode 14 contacting on the low resistivity substrate 10. Compared to the conventional Schottky rectifier as shown in FIG. 1, in which the cathode metal contacts to a POCl₃ doping region, the Schottky rectifier disclosed here has a much lower parasitic resistance at the cathode, a lower Vf, and with tighter distribution.

Additional embodiments are described below. To avoid repetition, only the differences from the first embodiment shown in FIG. 2 are described, and elements having similar functions or properties are designated with same numerals in the drawings as in the first embodiment.

Figure 21:
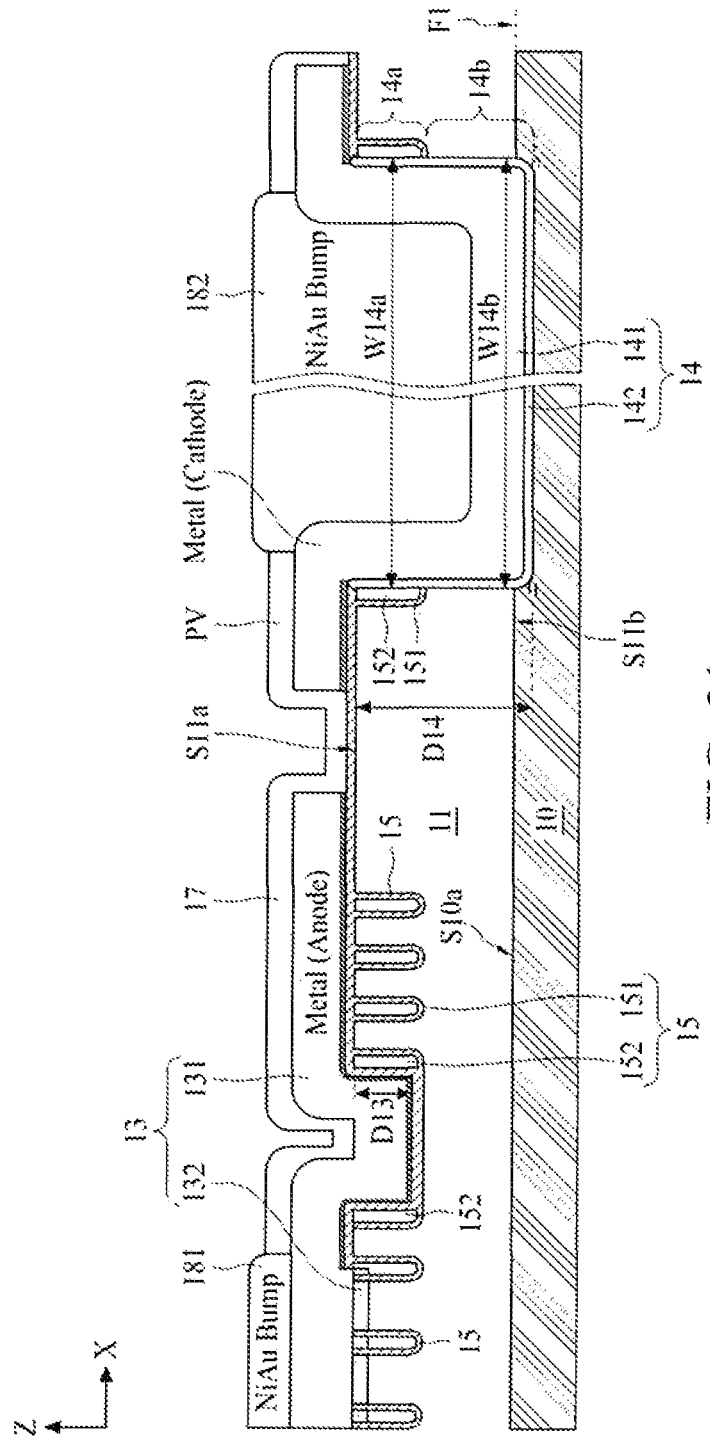
FIG. 21 depicts the cross section view of a Schottky rectifier.
Figure 22:
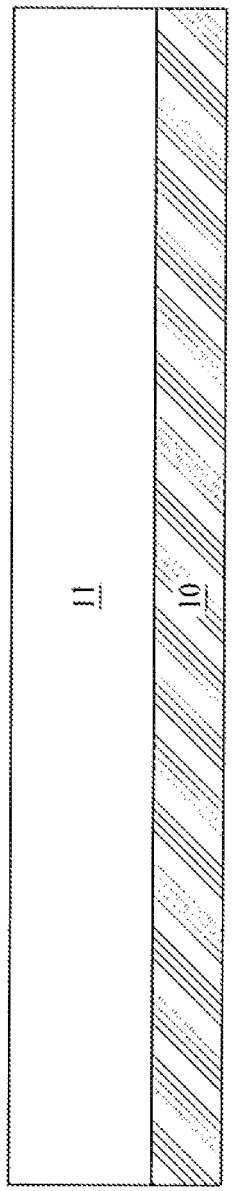
FIG. 22 depicts a cross section view of a starting wafer.
Figure 23:
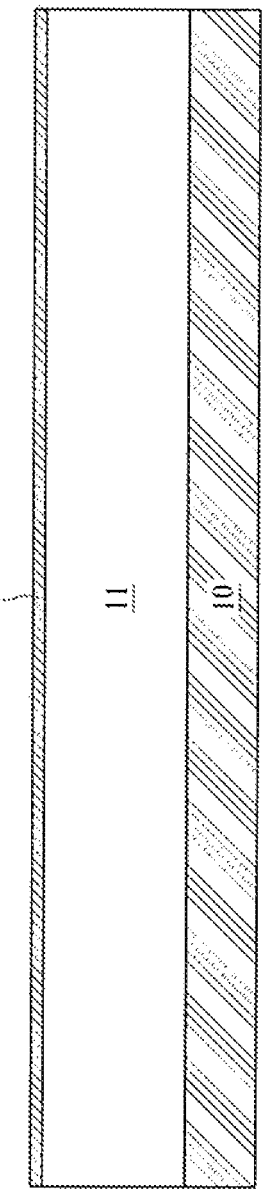
FIG. 23 depicts a cross section view of the starting wafer in FIG. 22 after an oxide film is disposed on the top surface.
Figure 24:
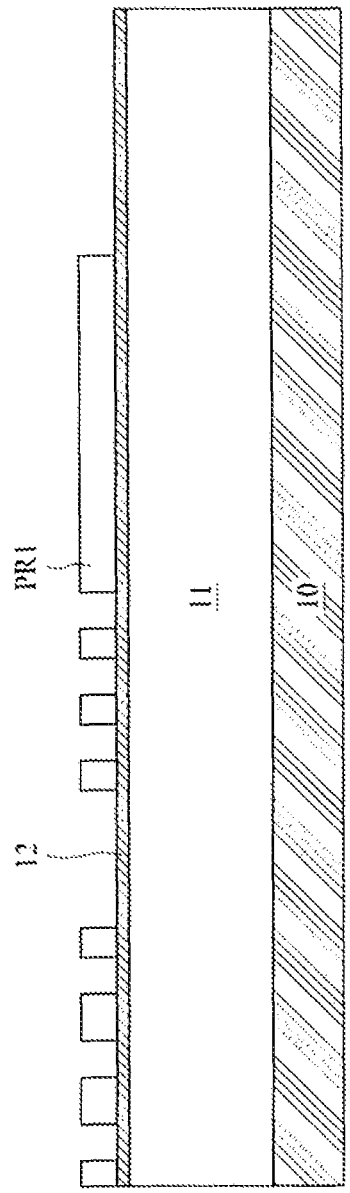
FIG. 24 depicts a cross section view of the wafer in FIG. 23 with a photoresist pattern disposed over the oxide film.
Figure 25:
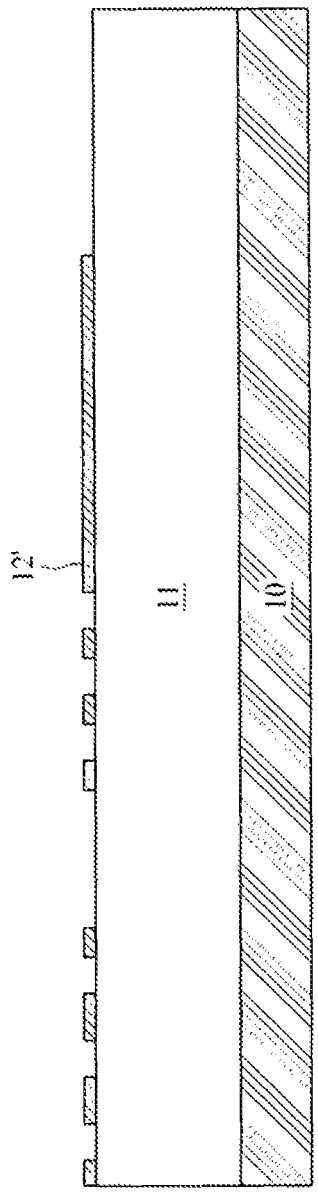
FIG. 25 depicts a cross section view of the wafer in FIG. 24 after the oxide film is etched according.
Figure 26:
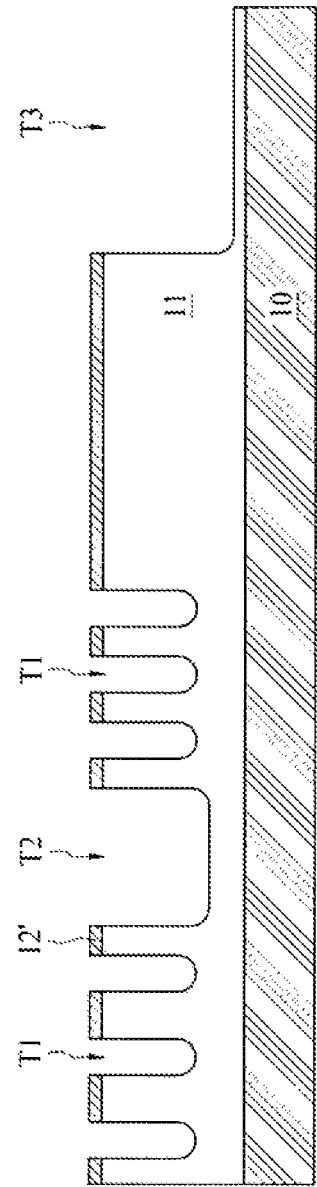
FIG. 26 depicts a cross section view of the wafer in FIG. 25 after trenches are etched extending into the wafer.
Figure 27:
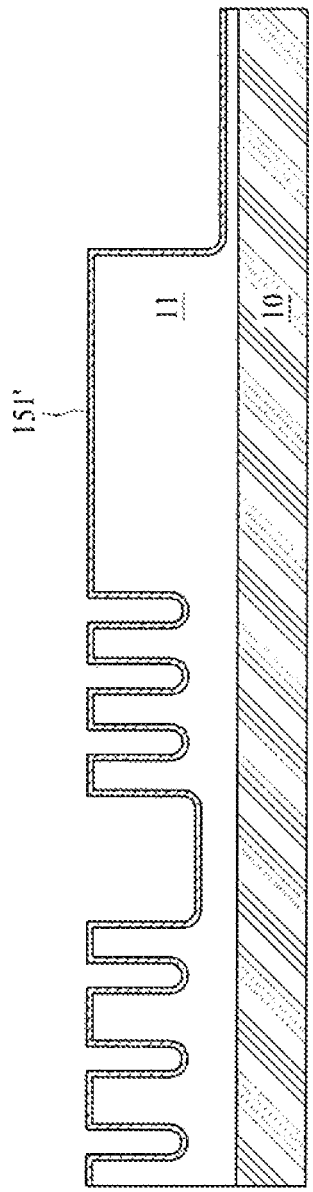
FIG. 27 depicts a cross section view of the wafer in FIG. 26 after a gate oxide film is disposed on the top surface of the wafer.
Figure 28:
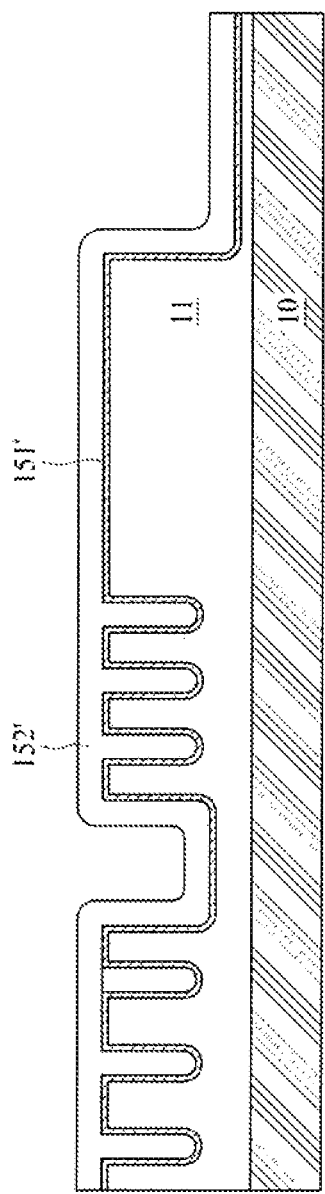
FIG. 28 depicts a cross section view of the wafer in FIG. 27 after a polysilicon film is disposed on the top surface of the wafer.
Figure 29:
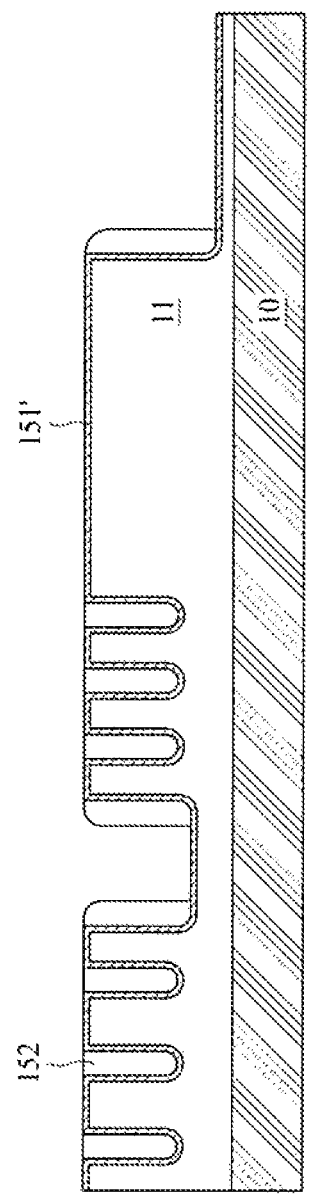
FIG. 29 depicts a cross section view of the wafer in FIG. 28 after the polysilicon film is etched back.
Figure 30:
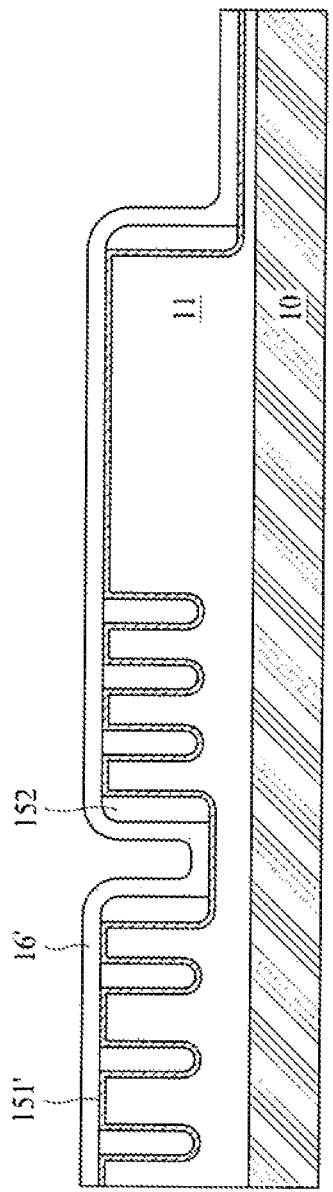
FIG. 30 depicts a cross section view of the wafer in FIG. 29 after an interlayer dielectric film is disposed on the top of the wafer.

FIG. 21 is a cross section drawing of a different Schottky rectifier SR2, which also embodies certain aspects of the present invention. The Schottky rectifier SR2 as depicted in FIG. 21 has a U-shaped cathode structure and is without a step at the bottom of the cathode trench structure. The width of the trench T3 in SR2 measured along the Z direction is substantially constant from near the surface of the trench so the epi-layer to the substrate—that is, W14$a$ is substantially equal to W14$b$. The metal layer 141 is conformal to the trench shape, and the solder bump 182 goes deep into the trench. In addition, a metal silicide layer 142 forms on the sidewall of the cathode trench and on one side of the polysilicon feature in the cathode trench.

Method M20 below further details the fabrication process of the Schottky rectifier SR2.

The method M20 includes process steps O201 to O230:
(O201) wafer start: providing a wafer with an epitaxial layer on a doped silicon;
(O202) trench hard mask oxide deposition (e.g. by CVD oxide);
(O203) trench photoresist patterning;
(O204) trench hard mask etching;
(O205) photoresist removal;
(O206) trench etching using the patented hard mask;
(O207) sacrificial oxide growth;
(O208) sacrificial oxide removal;
(O209) gate oxide (GOX) growth;
(O210) in-situ n-type polysilicon deposition;
(O211) poly etching back;
(O212) interlayer dielectric layer (ILD) deposition;
(O213) contact photoresist pattern formation;
(O214) ILD and GOX etching;
(O215) photoresist removal;
(O216) second contact photoresist pattern deposition;
(O217) cathode region silicon etching;
(O218) photoresist removal;
(O219) titanium sputtering;
(O220) rapid thermal process (RTP) to form TiSi$_x$;
(O221) metal layer deposition;
(O222) metal photoresist pattern formation;
(O223) metal etching;
(O224) photoresist removal;
(O225) passivation film deposition;
(O226) passivation photoresist pattern formation;
(O227) passivation film etching;
(O228) photoresist removal;
(O229) sintering and wafer testing; and
(O230) metal plating to form contact bumps on the metal layer.

FIG. 22 to FIG. 39 are cross section drawing of the Schottky rectifier SR2 at different stages of the process method M20.

Figure 31:
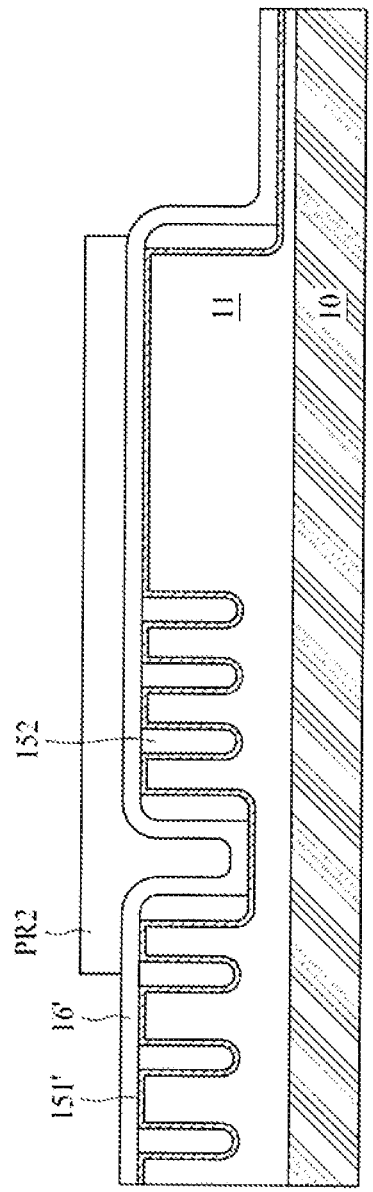
FIG. 31 depicts a cross section view of the wafer in FIG. 30 after a photoresist pattern delineating the anode and the cathode regions is disposed on the top of the wafer.

As depicted in FIG. 31, the photoresist pattern formed in the operation O213 is different form the photoresist pattern formed in the operation O113 as shown in FIG. 12. The photoresist pattern PR2 in FIG. 12 covers the side of the polysilicon layer 152 in the trench T3, but the photoresist pattern PR2 in FIG. 31 exposes one side of the polysilicon layer.

Figure 32:
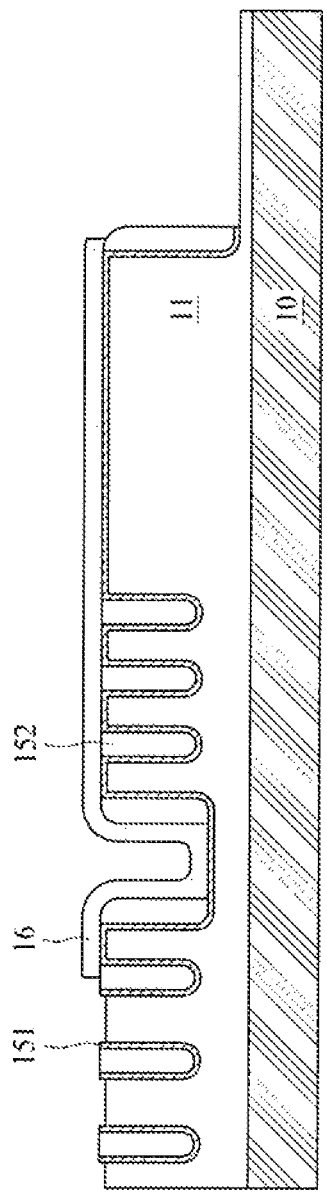
FIG. 32 depicts a cross section view of the wafer in FIG. 31 after the exposed interlayer dielectric and gate oxide are etched.

The process steps O214 to O215 are as depicted in FIG. 32 are similar to the process steps O114 to O115.

Figure 33:
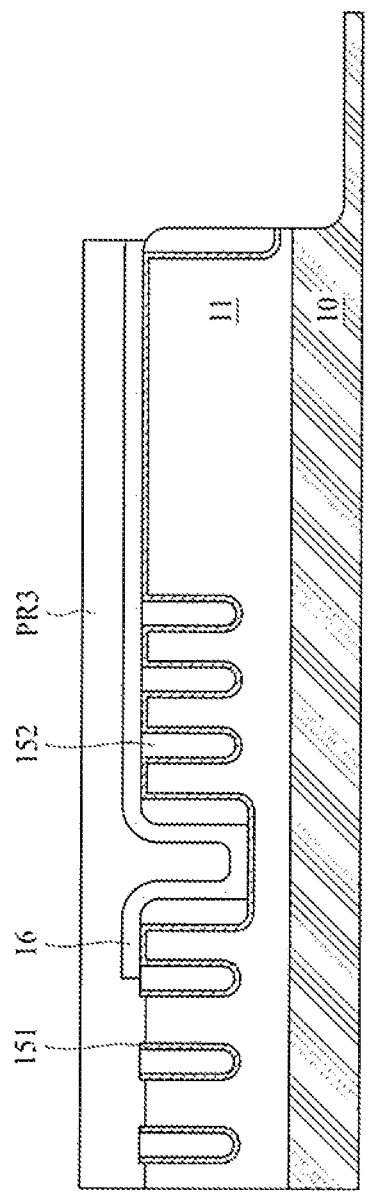
FIG. 33 depicts a second photoresist pattern applied and the exposed silicon and polysilicon sidewall.
Figure 34:
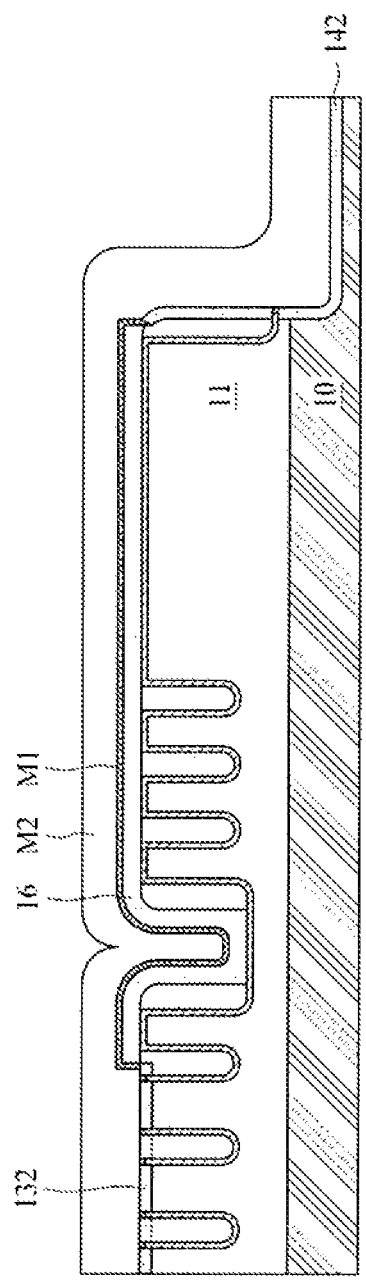
FIG. 34 depicts on the wafer of FIG. 33 after the formation of a silicide layer on silicon and on the sidewall polysilicon and the subsequent deposition of a metal layer.
Figure 35:
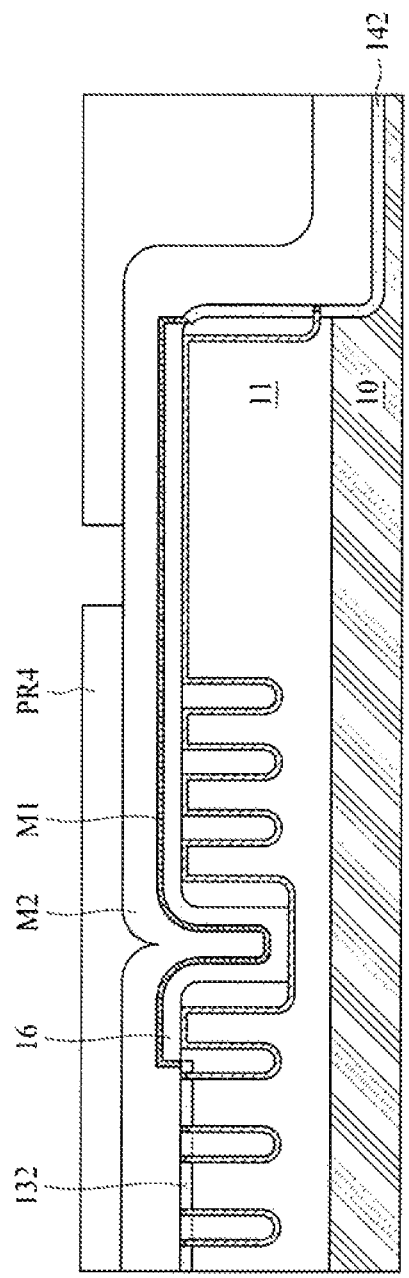
FIG. 35 depicts a photoresist pattern disposed over the metal layer.
Figure 38:
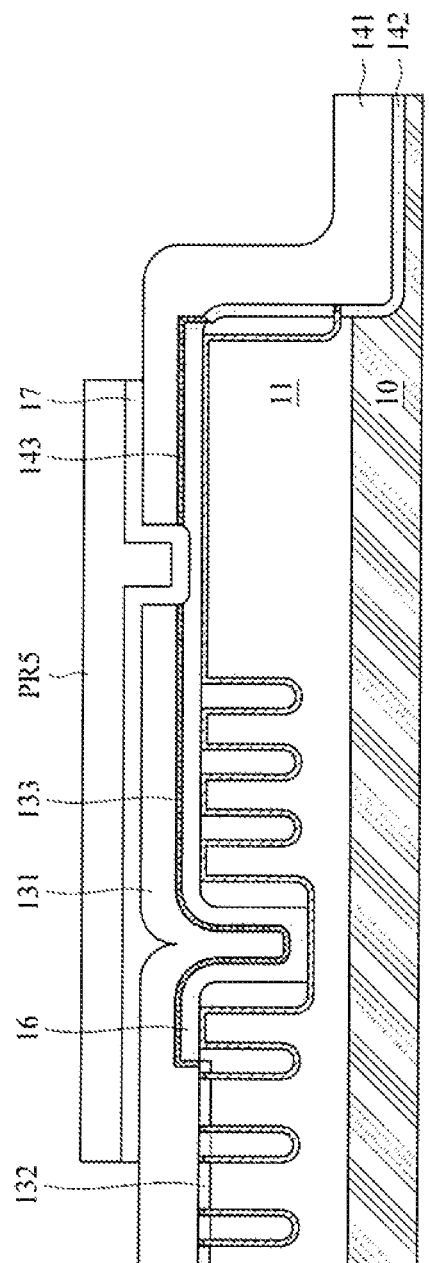
FIG. 38 depicts the structure of FIG. 37 after the passivation layer is removed from the cathode and the anode regions.
Figure 39:
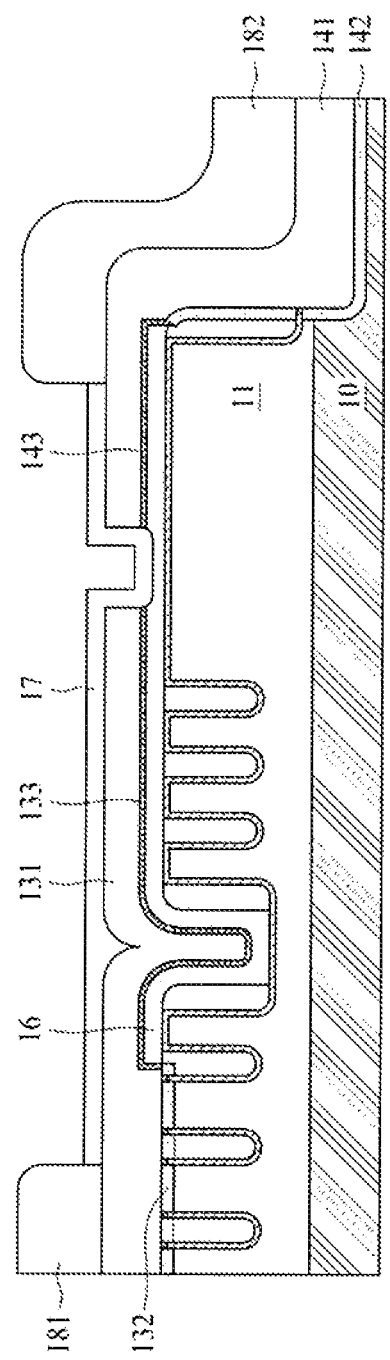
FIG. 39 depicts the structure of FIG. 19 after a layer of metal is plated at the cathode and anode regions.

The photoresist pattern formed in the step O216 as shown in FIG. 33 is different from the photoresist pattern formed in the step O116 as shown in FIG. 14. The photoresist pattern in FIG. 33 is substantially aligned an edge of the oxide layer 16 over the polysilicon at the sidewalls in the trench T3. Following the etch, the trench T3 has a substantially straight sidewall as depicted in FIG. 33. The metal silicide layer 142 extends from a bottom of the trench T3 and up along the sidewall and on the side of the polysilicon element on the trench T3 sidewalls.

Figure 40:
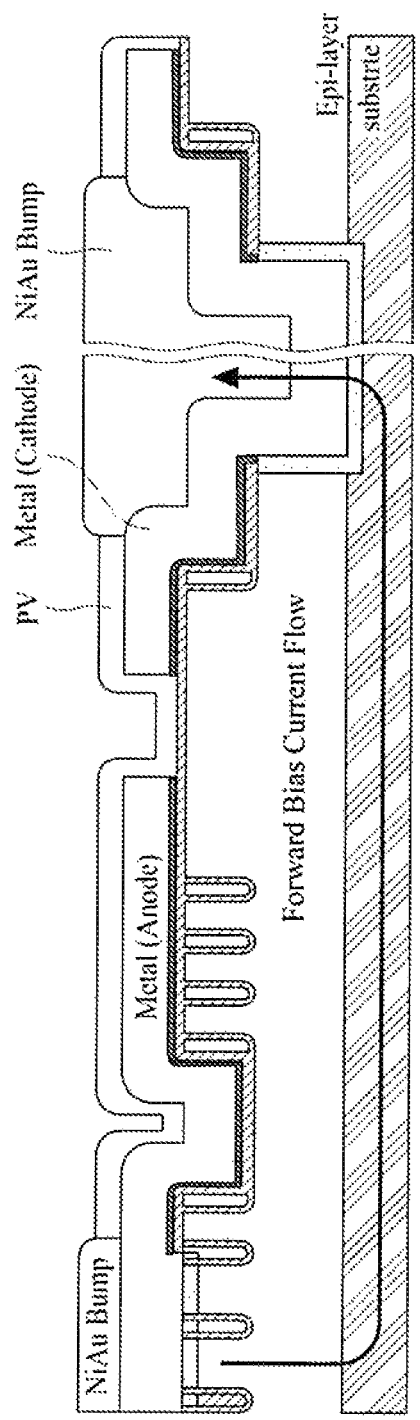
FIG. 40 depicts the cross section view of a Schottky rectifier. The arrow depicts the direction of current flow in the Schottky rectifier.

FIG. 40 depicts the Schootky rectifier under forward bias applied across the anode and the cathode. The arrow depicts the direction of the electric current flowing from the Schootky diode through the substrate to the cathode. The current path at the cathode contact avoids the high resistive epitaxial region and improves the device performance.

What is claimed is:

1. A semiconductor Schottky rectifier device, comprising:
a semiconductor substrate;
a semiconductor epitaxial material layer disposed over the substrate;
an arranged trench structure comprising a plurality of trenches extending from an epitaxial layer into the substrate, each trench having vertical sidewalls of the epitaxial material;
an extension of the vertical sidewalls of the epitaxial material perpendicular to the sidewalls near a bottom of the trench structure;
a first metal silicide film, disposed over a top of the epitaxial layer and extending into the trench structure;
a polysilicon element disposed between the vertical sidewalls and the first metal silicide film in an upper portion of the trench structure, the first metal silicide film being in contact with the vertical sidewalls of the epitaxial material in a lower portion of the trench structure;
a gate oxide film disposed between the vertical sidewalls and the polysilicon element;
an extension of the gate oxide film separating a bottom of the polysilicon element from the extension of the epitaxial material sidewalls; and
a Schottky junction diode near a top surface of the epitaxial layer distant from the trench structure.

2. A semiconductor Schottky rectifier device, comprising
a semiconductor substrate;
a semiconductor epitaxial layer (epi-layer) over the substrate;

an anode structure and a cathode structure both extending from a top surface of the epi-layer towards the substrate;

the cathode structure having an arranged trench structure comprising a plurality of trenches, each trench having an epi-layer sidewall surface;

a gate oxide layer covering the epi-layer sidewall surface;

a polysilicon sidewall element adjacent the epi-layer sidewall surface electrically isolated from the epi-layer by the gate oxide layer;

a first metal silicide film extending into the trench structure directly on a surface of the polysilicon sidewall element in an upper portion of the trench structure and away from the epi-layer sidewall surface, the first metal silicide film being in contact with the epitaxial layer in a lower portion of the trench structure;

an extension of the first metal silicide film covering a portion of the epi-layer and a portion of the substrate; and a second metal silicide film electrically isolated from the first metal silicide film, forming a Schottky junction diode with the semiconductor epitaxial layer.

3. The semiconductor Schottky device of claim 1, further comprising a first metal layer over the first metal silicide film.

4. The semiconductor Schottky device of claim 3, further comprising a second metal layer covering a second metal silicide film and electrically isolated from the first metal layer.

5. The semiconductor Schottky device of claim 4, in which a portion of the substrate is about 100 μm thick.

6. The semiconductor Schottky device of claim 4, in which a portion of the substrate is about 20 μm thick.

7. The semiconductor Schottky device of claim 4, further comprising a step feature between the bottom of the cathode structure and the top surface of the epitaxial layer.

8. The semiconductor Schottky device of claim 1, in which a side of the polysilicon element opposite the sidewalls is covered with a dielectric film.

9. The semiconductor Schottky device of claim 7, further comprising an extension of the epitaxial layer at the bottom of the trench structure.

10. A semiconductor Schottky device, comprising
a semiconductor substrate and a semiconductor epitaxial layer (epi-layer) over the substrate;
an anode contact structure and a cathode contact structure both extending from a top surface of the epi-layer;
the cathode contact structure having a trench structure into the epi-layer with a vertical sidewall of an epitaxial material covered with a first metal silicide layer; and
a Schottky contact disposed between a second silicide layer and the epi-layer, the Schottky contact connected to the anode contact structure;
wherein the first metal silicide layer is in direct contact with a polysilicon element in an upper portion of the sidewall of the trench structure and in direct contact with the epitaxial material in a lower portion of the sidewall of the trench structure.

11. The semiconductor Schottky device of claim 10, further comprising a first metal layer adjacent to the first metal silicide layer.

12. The semiconductor Schottky device of claim 11, in which the epitaxial material extends from the vertical sidewall and forms a step between a top surface of the epitaxial layer and a bottom of the trench structure of the cathode contact structure.

* * * * *